(12) United States Patent
Balan et al.

(10) Patent No.: US 6,343,268 B1
(45) Date of Patent: *Jan. 29, 2002

(54) ESTIMATOR OF INDEPENDENT SOURCES FROM DEGENERATE MIXTURES

(75) Inventors: Radu Balan, New York, NY (US); Alexander Jourjine, Princeton; Justinian Rosca, Monmouth Junction, both of NJ (US)

(73) Assignee: Siemens Corporation Research, Inc., Princeton, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/203,115

(22) Filed: Dec. 1, 1998

(51) Int. Cl.⁷ .......................... G10L 21/02; H04B 15/00
(52) U.S. Cl. ...................... 704/228; 704/226; 704/233; 381/94.1; 381/94.2; 706/22
(58) Field of Search .................. 704/226, 228, 704/233; 381/94.1, 94.2; 706/22

(56) References Cited

U.S. PATENT DOCUMENTS

| | | | |
|---|---|---|---|
| 5,539,832 A | * | 7/1996 | Weinstein et al. ......... 381/94.1 |
| 5,706,402 A | * | 1/1998 | Bell ............... 706/22 |
| 5,721,694 A | * | 2/1998 | Graupe ......... 702/191 |
| 5,808,913 A | * | 9/1998 | Choi et al. ......... 702/191 |
| 5,943,429 A | * | 8/1999 | Handel ............... 381/94.2 |
| 6,067,513 A | * | 5/2000 | Ishimitsu ............... 704/233 |

OTHER PUBLICATIONS

Tugnair, J.K. "Linear identification of non–Gaussian non-causal auto regressive signal–in–noise processes" Aug. 26, 1989, p. 447–450.*
Taleb, A. et al. "On underdetermined source separation" IEEE Mar. 10, 1999, p. 1445–1448.*
Verbout, S.M. et al. "Parameter estimation for autoregressive Gaussian–mixture processes: the EMAX algprithm" IEEE Apr. 24, 1997 p. 3549–3552.*
Tugnait, J.K. "Approaches of FIR system identification with noisy data using higher–order statistics" IEEE Jul. 1990. p. 1307–1317.*
Tugnait, J.K. "On blind separation of convolutive mixtures of independent linear signals in unknown addative noise" IEEE 11/98 p. 3117–3123.*

* cited by examiner

*Primary Examiner*—Richemond Dorvil
*Assistant Examiner*—Vijay B Chawan
(74) *Attorney, Agent, or Firm*—Donald B. Paschburg

(57) ABSTRACT

A system that reconstructs independent signals from degenerate mixtures estimates independent Auto Regressive (AR) processes from their sum. The system includes an identification system and an estimator. A mixture of two signals is inputted into the system and through the identifying and filtering processes, two estimates of the original signals are outputted. The identification system includes an ARMA identifier, a computation of autocovariance coefficients, an initializer and a gradient descent system. The estimator includes filtering.

17 Claims, 2 Drawing Sheets

ESTIMATOR OF INDEPENDENT SOURCES FROM DEGENERATE MIXTURES

BACKGROUND OF THE INVENTION

1. Field of the Invention

The present invention relates to blind source separation problems and more particularly to estimating independent Auto Regressive (AR) processes from their sum.

2. Description of the Prior Art

A generic Blind Source Separation (BSS) problem is defined by the following: given m measurements $x_1, \ldots, x_m$ obtained from n independent signals (sources) $s_1, \ldots, s_n$, estimate the original signals through n estimators $\hat{s}_1, \ldots, \hat{s}_n$, based on the time-series $x_1(\cdot), \ldots, x_m(\cdot)$.

Current BSS literature addresses only the case when the number of sources is equal to the number of microphones, in example m=n. This is discussed by S. Amari in "Minimum Mutual Information Blind Separation", *Neural Computation*, 1996, by A. J. Bell and T. J. Sejnowski in "An Information-maximization Approach To Blind Separation And Blind Deconvolution", *Neural Computation*, 7:1129–1159, 1995, by J. F. Cardoso in "Infomax And Maximum Likelihood For Blind Source Separation", *IEEE Signal Processing Letters*, 4(4):112–114, April 1997, by P. Comon in "Independent Component Analysis, A New Concept?", *Signal Processing*, 36(3):287–314, 1994, by C. Jutten and J. Herault in "Blind Separation Of Sources, Part I: An Adaptive Algorithm Based On Neuromimetic Architecture", *Signal Processing*, 24(1):1–10, 1991, by B. A. Pearlmutter and L. C. Parra in "A Context-sensitive Generalization Of ICA", In International Conference on *Neural Information Processing*, Hong Kong, 1996, by K. Torkkola in "Blind Separation Of Convolved Sources Based On Information Maximization", In *IEEE Workshop on Neural Networks for Signal Processing*, Kyoto, Japan 1996. The case when the number of measurements m is strictly smaller than the number of sources n is called the degenerate case.

It is an object of the present invention to reconstruct independent signals from degenerate mixtures. More specifically, it is an object of the present invention to estimate independent Auto Regressive (AR) processes from their sum.

SUMMARY OF THE INVENTION

The present invention is a system that reconstructs independent signals from degenerate mixtures. More specifically, the present invention estimates independent Auto Regressive (AR) processes from their sum. The invention addresses the identification subsystem for such a degenerate case, particularly the case of two AR processes of known finite dimension (m=1 and n=2).

The present invention includes an identification system and an estimator. A mixture signal and noise are inputted into the system and through noise separation, a near pure signal is outputted. The identification system includes an ARMA identifier, a computation of autocovariance coefficients, an initializer and a gradient descent system. The estimator includes filtering.

DETAILED DESCRIPTION OF THE INVENTION

The present invention is a system that reconstructs independent voices from degenerate mixtures by estimating independent Auto Regressive (AR) processes from their sum. The invention addresses the identification subsystem for such a degenerate case, particularly the case of two AR processes of known finite dimension (m=1 and n=2).

Figure 1:
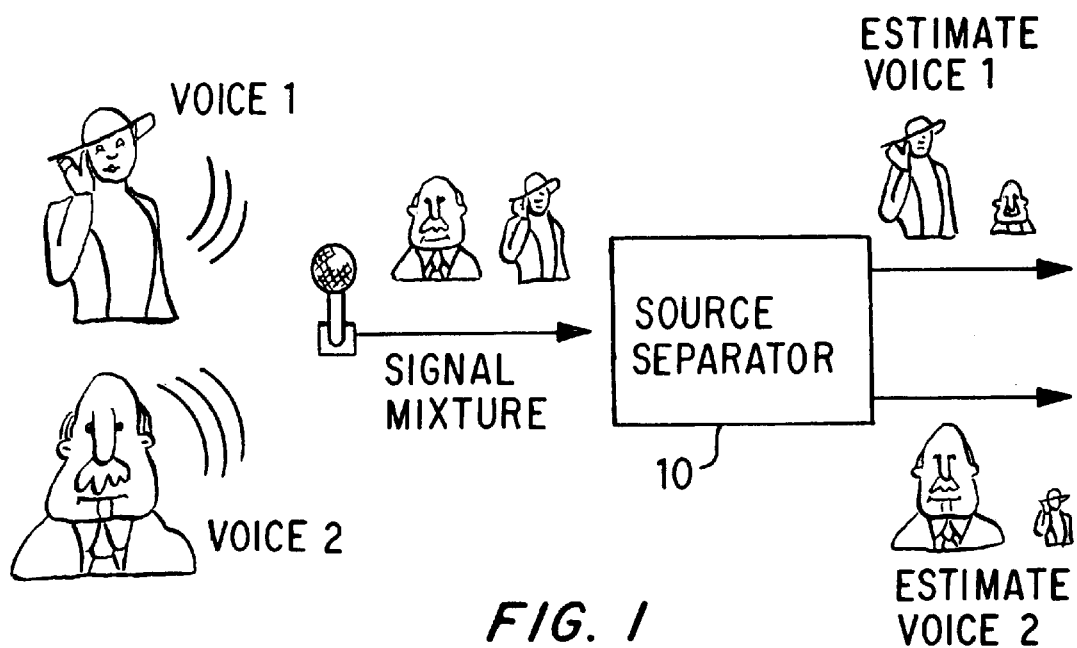
FIG. 1 illustrates an example including the present invention.

FIG. 1 illustrates an example utilizing the present invention. A mixture signal, such as two voices, is inputted into the system and through source identification and filtering by source separator 10, an estimate of original sources are outputted from the present invention. The present invention estimates n unknown independent components $S_1, \ldots, S_n$ (sources) from observed signals $x_1, \ldots, x_m$ that are assumed to be linear combinations of the independent components. The present invention solves problems caused by degenerate source mixtures.

In the present invention the following assumptions are made:

1. There are two weakly stationary and independent sources $S_1$ and $s_2$ of zero mean, i.e.

$$E[s_j(k)s_j(k-n)]=E[s_j(l)s_j(l-n)], \text{ for every } k,l,j=1,2$$

$$E[s_1(k)s_2(l)]=E[s_1(k)]=E[s_2(l)]=0, \text{ for every } k,l \quad (1)$$

2. The source signals are obtained from two Auto Regressive (AR)(p) processes of order p as follows:

$$s_1(n)=-a_1s_1(n-1)-a_2s_1(n-2)-\ldots-a_ps_1(n-p)+G_1v_1(n)$$

$$s_2(n)=-b_1s_2(n-1)-b_2s_2(n-1)-\ldots-b_ps_2(n-p)+G_2v_2(n) \quad (2)$$

where $v_1$ and $v_2$ are two independent unit variance white-noises, $a_1, \ldots, a_p, G_1$ and $b_1, \ldots, b_p, G_2$ are the parameters of the first, respectively the second, AR(p) process.

3. The order p is assumed known.

4. The measurement is a scalar sum of the signals:

$$x(n)=s_1(n)+s_2(n) \quad (3)$$

and is known.

As stated above, the present invention estimates the original signals. The estimators $\hat{s}_1(\cdot), \hat{s}_2(\cdot)$ that are constructed are optimal with respect to the conditional variance of the error.

The system solves the signal mixture separation problem. More specifically, a simultaneous record of two signals is given. The implementation of the system estimates each original signal. The system works best with unechoic voice signals, which can be well approximated by univariate AR processes of some order p.

Figure 2:
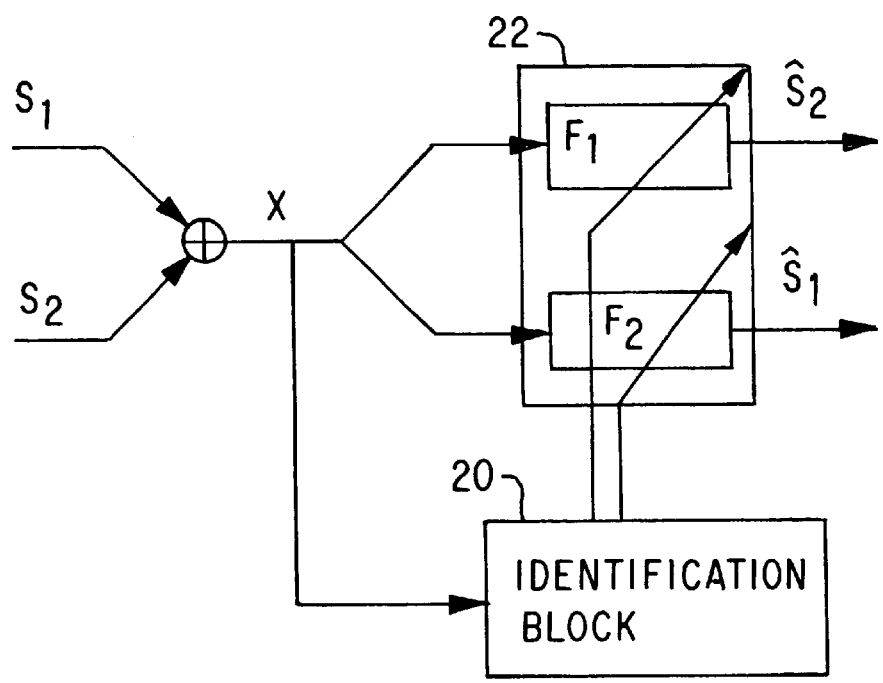
FIG. 2 illustrates a block diagram of the present invention.

As shown in FIG. 2, the major components of the present invention are the identifier 20 and the estimator 22. There are two implementations of the present invention: an off-line implementation and an on-line implementation. Identifier 20 implements an identification system shown in FIG. 3 and estimator 22, in one embodiment, is actually two Wiener filters. Identifier 20 produces an estimate of the unknown AR parameters $\hat{a}_1, \ldots, \hat{a}_p, \hat{G}_1, \hat{b}_1, \ldots, \hat{b}_p, \hat{G}_2$. Estimator 22 gives the minimum variance estimates based on these parameters.

Figure 3:
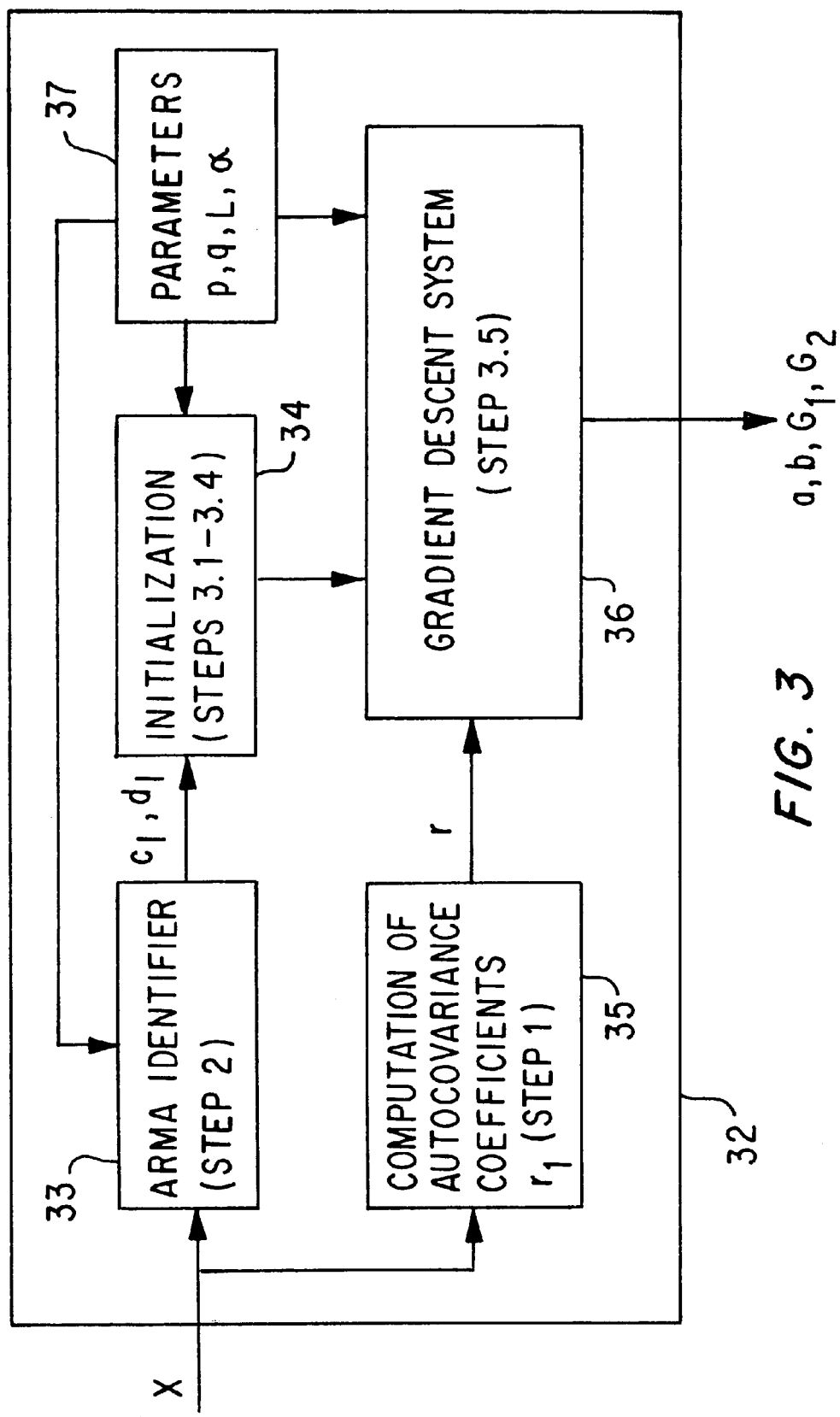
FIG. 3 illustrates a block diagram of the identification system.

As shown in FIG. 3, sources s are linearly mixed in the environment. Identification system 32 receives input x from the mixing environment. Identification system 32 includes ARMA identifier 33, initializer 34, computation of autocovariance coefficients 35 and gradient descent system 36. ARMA identifier 33, initializer 34 and gradient descent system 36 receive parameters p, q, l and α from parameter block 37. Outputted from identification system 32 are source estimates.

ARMA identifier 33 performs the operation described by step 2 below. Computation of autocovariance coefficients 35 performs the operation described by step 1 below. Initializer 34 performs the operation described by steps 3.1 through 3.4 and the gradient descent system 36 performs the operation of step 3.5 described below.

The off-line implementation assumes the entire measured signal is known from the start. Thus $\{x(n)\}_n$ is known for $n=1, \ldots, N$ and the method computes the estimates $\hat{s}_1(n)\}_n, \{\hat{s}_2(n)\}_n$ based on this knowledge. In the on-line implementation, at the moment t only the samples $\{x(n)\}_n$ for $n=1, \ldots, t$ are known. Based on this information, the system produces the estimates $\hat{s}_1(t+1), \hat{s}_2(t+1)$ immediately after it receives $x(t+1)$. Variations along this line are also considered. For instance the measured signal is split into time-windows of length $M_0$, $$(x_j(k)\})_{k=1,\ldots,M_0}, j = 1, \ldots, \frac{N}{M_0},$$

$$x_j(k) = x(M_0 j + k), k = 1, \ldots, M_0.$$

Then, for a given $j_0$, immediately after the moment $M_0 j_0$, the system produces the estimates $$\hat{s}_1((j_0-1)M_0+k)\}_{k=1,\ldots,M_0}, \{\hat{s}_2((j_0-1)M_0+k)\}_{k=1,\ldots,M_0}.$$

Thus the length $M_0$ controls the time lag between the original signals and their estimates.

The present invention is based on the second order statistics of the measurement characterized through the sampled autocovariance coefficients computed in the off-line implementation through $$\hat{r}(l) = \frac{1}{N} \sum_{k=l+1}^{N} x(k)x(k - l) \quad (4)$$

In the on-line implementation, these coefficients are estimated through (24).

In the off-line implementation, identifier 20 performs the following steps with the following inputs:

$$\{x(n)\}_{n=1,\ldots,N}, P, \text{ and constants: } L, q, \alpha_0, \ldots, \alpha_L, \epsilon$$

Step 1. Compute $\hat{r}(l)$ for $l=0, \ldots, L$;
Step 2. Identify the measured signal as an ARMA(2p,p) process.
Thus two polynomials, one of degree p, $$Q(z) = \sum_{l=0}^{p} c_l z^l \quad (5)$$

and another of degree 2p, $$P(z) = 1 + \sum_{l=1}^{2p} d_l z^l \quad (6)$$

are obtained. The zeros of P define the ARMA(2p,p) process poles.
Step 3. For each partition of the 2p poles identified at Step 2, into two admissible sets of p poles repeat:

3.1 Find $P_1$ and $P_2$ the $p^{th}$ degree polynomials whose roots are, respectively, p poles from each partition. Set $a_l^{(0)}$, $b_l^{(0)}$ $l=0, \ldots, p$ the coefficients of $P_1, P_2$ as follows:

$$P_1(z) = 1 + \sum_{l=1}^{p} a_l^{(0)} z^l, a_0^{(0)} = 1 \quad (7)$$

$$P_2(z) = 1 + \sum_{l=1}^{p} b_l^{(0)} z^l, b_0^{(0)} = 1$$

3.2 Solve the following linear system:

$$\begin{bmatrix} \sum_{l=-p}^{p} h_l^2 & \sum_{l=-p}^{p} h_l g_l \\ \sum_{l=-p}^{p} h_l g_l & \sum_{l=-p}^{p} g_l^2 \end{bmatrix} \cdot \begin{bmatrix} x_1 \\ x_2 \end{bmatrix} = \begin{bmatrix} \sum_{l=-p}^{p} h_l f_l \\ \sum_{l=-p}^{p} g_l f_l \end{bmatrix} \quad (8)$$

where $f_1, g_1, h_1$ are obtained as coefficients of $$Q(z)Q\left(\frac{1}{z}\right) = \sum_{l=-p}^{p} f_l z^l \quad (9)$$

$$P_1(z)P_1\left(\frac{1}{z}\right) = \sum_{l=-p}^{p} g_l z^l$$

$$P_2(z)P_2\left(\frac{1}{z}\right) = \sum_{l=-p}^{p} h_l z^l$$

3.3 If $x_1<0$ or $x_2<0$ then this partition is not suitable and therefore move to the next partition. Go to Step 3.

3.4 Set $$G_1^{(0)} = \sqrt{x_1}, G_2^{(0)} = \sqrt{x_2} \quad (10)$$

3.5 Using the gradient descent algorithm minimize the following criterion:

$$J(G_1, G_2, a, b, p, L, \alpha, \hat{r}, q) = \quad (11)$$

$$\sum_{l=0}^{L} \alpha_l \left| a * b * \hat{r}(l) - \sum_{k=l}^{p} (G_1 b_k \Psi_1(k - l) + G_2 a_k \Psi_2(k - l)) \right|^q$$

where $\Psi_1(l), \Psi_2(l), l=0, \ldots, p$ are obtained from the following triangular linear system, $$\sum_{j=0}^{l} a_j \Psi_1(l - j) = G_1 \delta_{l,0}, l = 0, \ldots, p \quad (12)$$

$$\sum_{j=0}^{l} b_j \Psi_2(l - j) = G_2 \delta_{l,0}, l = 0, \ldots, p$$

with $$a_0 = b_0 = 1$$

$$a * b * \hat{r}(l) = \sum_{k=0}^{2p} \sum_{j=0}^{k} a_j b_{k-j} \hat{r}(l-k) \qquad (13)$$

$\alpha_l$, $l=0, \ldots, L$, are fixed positive weights and L,q are parameters.

Practically, the gradient descent step is performed as follows:

3.5.1 Set m=0 and compute $$J^{(old)} = J(G_1^{(m)}, G_2^{(m)}, a^{(m)}, b^{(m)}, p, L, \alpha, \hat{r}, q) \qquad (8)$$

3.5.2 Evaluate the gradient of J at $G_1^{(m)}$, $G_2^{(m)}$, $a^{(m)}$, $b^{(m)}$ in $$Da^{(m)} = \nabla_a J(G_1^{(m)}, G_2^{(m)}, a^{(m)}, b^{(m)}, p, L, \alpha, \hat{r}, q)$$

$$Db^{(m)} = \nabla_b J(G_1^{(m)}, G_2^{(m)}, a^{(m)}, b^{(m)}, p, L, \alpha, \hat{r}, q)$$

$$DG_1^{(m)} = \frac{\partial J}{\partial G_1}(G_1^{(m)}, G_2^{(m)}, a^{(m)}, b^{(m)}, p, L, \alpha, \hat{r}, q) \qquad (9)$$

$$DG_2^{(m)} = \frac{\partial J}{\partial G_2}(G_1^{(m)}, G_2^{(m)}, a^{(m)}, b^{(m)}, p, L, \alpha, \hat{r}, q)$$

3.5.3 Set t=1 and repeat $$ax = a^{(m)} - t \cdot Da^{(m)}$$

$$bx = b^{(m)} - t \cdot Db^{(m)}$$

$$Gx_1 = G_1^{(m)} - t \cdot DG_1^{(m)}$$

$$Gx_2 = G_2^{(m)} - t \cdot DG_2^{(m)}$$

$$J_x = J(Gx_1, Gx_2, ax, bx, p, L, \alpha, \hat{r}, q)$$

$$t = t/2 \qquad (16)$$

until $J_x < J^{(old)}$ 3.5.4 Set $$a^{(m+1)} = a^{(m)} - 2tDa^{(m)}$$

$$b^{(m+1)} = b^{(m)} - 2tDb^{(m)}$$

$$G_1^{(m+1)} = G_1^{(m)} - 2tDG_1^{(m)}$$

$$G_2^{(m+1)} = G_2^{(m)} - 2tDG_2^{(m)}$$

$$J^{(new)} = J_x \qquad (17)$$

3.5.5 If $(J^{(old)} - J^{(new)})/J^{(old)} \epsilon$ set $$m = m+1$$

$$J^{(old)} = J^{(new)} \qquad (18)$$

and go to 3.5.2.

Else set $$a^{(partition)} = a^{(m+1)}$$

$$b^{(partition)} = b^{(m+1)}$$

$$G_1^{(partition)} = G_1^{(m+1)}$$

$$G_2^{(partition)} = G_2^{(m+1)}$$

$$J_{opt}(\text{partition}) = J^{(new)} \qquad (19)$$

Step 4. Choose the partition that gives the smallest criterion, i.e.

$$\text{optim\_partition} = \arg \min_{partition} J_{opt}(\text{partition}) \qquad (20)$$

Set:

$$\hat{a} = a^{option\_partition}$$

$$\hat{b} = b^{option\_partition}$$

$$\hat{G}_1 = G_1^{option\_partition}$$

$$\hat{G}_2 = G_2^{option\_partition} \qquad (21)$$

Outputs: $\hat{a}, \hat{b}, \hat{G}_1, \hat{G}_2$.

This identification procedure uses a number of parameters. Experimentally, the following values work well:

$$L = 3p$$

$$q = 2$$

$$\alpha_l = 1, l = 0, \ldots, L$$

$$\epsilon = 10^{-3} \qquad (22)$$

For the purposes of the Step 3, a set of complex numbers is said admissible if it is invariant under the complex conjugation operator, i.e. if z is in the set then $\bar{z}$ should belong to the set too.

Once the identification procedure has been done, the next step is the linear filtering of the signal x performed in estimator 20 of FIG. 2. The following will describe the off-line filtering block of estimator 20. The present invention uses Wiener filters to estimate $\hat{s}_1$ and $\hat{s}_2$. The Wiener filters are the minimum variance linear estimators and have been widely used in the literature as noise reduction filters. For the AR sources estimation, the filters are defined through the following relations:

$$H_1(z) = \frac{\hat{G}_1^2 \hat{P}_2(z) \hat{P}_2\left(\frac{1}{z}\right)}{\hat{G}_1^2 \hat{P}_2(z) \hat{P}_2\left(\frac{1}{z}\right) + \hat{G}_2^2 \hat{P}_2(z) \hat{P}_2\left(\frac{1}{z}\right)} \qquad (23)$$

$$H_2(z) = \frac{\hat{G}_2^2 \hat{P}_1(z) \hat{P}_1\left(\frac{1}{z}\right)}{\hat{G}_1^2 \hat{P}_2(z) \hat{P}_2\left(\frac{1}{z}\right) + \hat{G}_2^2 \hat{P}_1(z) \hat{P}_1\left(\frac{1}{z}\right)}$$

where $$\hat{P}_1(z) = 1 + \sum_{l=1}^{p} \hat{a}_l z^l, \quad \hat{P}_2(z) = 1 + \sum_{l=1}^{p} \hat{b}_l z^l.$$

Since (23) defines non-causal filters, the algorithm uses a forward-backward implementation for each filter, based on the spectral factorization theorem.

The following will describe the on-line implementation and the on-line identification algorithm. For the on-line problem, the present invention uses an adapting mechanism of the identification procedure. Suppose the estimates $\hat{a}^{(m)}$, $\hat{b}^{(m)}, \hat{G}_1^{(m)}, \hat{G}_2^{(m)}$ of the parameters $a, b, G_1$ and $G_2$ based on the first m samples are given and the m+1$^{st}$ sample x(m+1) is known. The on-line algorithm describes how these estimates are adapted.

Input: $\hat{a}^{(m)}, \hat{b}^{(m)}, \hat{G}_1^{(m)}, \hat{G}_2^{(m)}, \hat{r}^{(m)}(l)$ and $x(m+1)$ Step 1. Update the autocovariance coefficients using an exponential-window, $$\hat{r}^{(m+1)}(l) = (1-w)\hat{r}^{(m)}(l) + wx(m+1)x(m+1-l), \; l=0,\ldots,L \quad (24)$$

Step 2. Perform one gradient descent step 3.5 from the off-line algorithm using the updated values of the autocovariance coefficients:

$$t^* = \arg\min_{t=2^{-n}} J\{G_1^{(m)} - t \cdot DG_1, G_2^{(m)} - t \cdot DG_2, \quad (25)$$
$$a^{(m)} - t \cdot Da, B^{(m)} - t \cdot Db, p, L, \alpha, \hat{r}^{(m+1)}, q\}$$

Update the new estimates:

$$a^{(m+1)} = a^{(m)} - t^*Da$$
$$b^{(m+1)} = b^{(m)} - t^*Db$$
$$G_1^{(m+1)} = G_1^{(m)} - t^*DG_1$$
$$G_2^{(m+1)} = G_2^{(m)} - t^*DG_2 \quad (26)$$

Step 3. Set m=m+1 and go to Step 1.
Outputs: $\hat{a}^{(m+1)}, \hat{b}^{(m+1)}, \hat{G}_1^{(m+1)}, \hat{G}_2^{(m+1)}, \hat{r}^{(m+1)}(l)$ The parameter w at Step 1 represents the adapting rate of the algorithm. Usually it is taken very close to 0.

The following will describe on-line filtering. The filtering block adapts its parameters (through (23)) at every $M_0$ samples. Depending on the application, either a forward-backward implementation is used (if the processes are slow), or the forward filtering part only is used (if the processes are fast). In the latter case, the forward filter is the causal (i.e. stable) part of (23).

The present invention solves problems caused by degenerate source mixtures. The present invention can be utilized in any application requiring speech enhancement and noise reduction such as hearing aids, mobile phones, stationary phones and speech recognition and detection systems. The present invention also has applications with source separation in EKG, EEG, magneto-encephalograms and fetal monitoring.

It is not intended that this invention be limited to the hardware or software arrangement or operational procedures shown disclosed. This invention includes all of the alterations and variations thereto as encompassed within the scope of the claims as follows.

What is claimed is:

1. An estimator of independent acoustic sources from degenerate mixtures comprising:
   an identification system for simultaneously receiving and identifying said independent sources from said degenerate mixtures, wherein said independent sources include Gaussian and non-Gaussian signals; and
   an estimator filter connected to said identification system for reconstructing said independent sources based on a second order estimation of a sum of said signals.

2. The estimator of independent sources from degenerate mixtures as claimed in claim 1 wherein said identification system comprises:
   an auto regressive moving average identifier;
   means for computing autocovariance coefficients connected to an auto regressive moving average identifier;
   an initializing device for assigning initial values connected to said auto regressive moving average identifier; and
   a gradient descent system connected to said initializing device and said means for computing autocovariance coefficients.

3. The estimator as recited in claim 2, wherein the auto regressive moving average identifier includes means for identifying degenerate signals as auto regressive processes and determining poles of the degenerate signals.

4. The estimator as recited in claim 3, wherein the auto regressive processes include polynomials, the polynomials having zero roots corresponding to poles of the auto regressive processes.

5. The estimator as recited in claim 2, wherein the initializing device computes process parameters for auto regressive processes output from the auto regressive moving average identifier.

6. The estimator as recited in claim 2, wherein the gradient descent system includes means for determining an estimate of auto regressive parameters to be output to the estimator filter.

7. The estimator as recited in claim 1, wherein the degenerate mixtures include discrete acoustic sources and the estimator filter outputs estimates of the discrete acoustic sources.

8. The estimator as recited in claim 7, wherein the discrete acoustic sources include human voices.

9. The estimator as recited in claim 1, wherein the estimator filter includes two Weiner filters.

10. The estimator as recited in claim 1, wherein the estimator is employed in one of a hearing aid, phones, speech recognition and detection systems and medical monitoring equipment.

11. A method for estimating independent acoustic sources from degenerate mixtures comprising the steps of:
    simultaneously providing degenerate mixtures of signals from a plurality of sources, wherein said sources include Gaussian and non-Gaussian signals;
    computing autocovariance coefficients for the degenerate mixtures;
    identifying the degenerate mixtures of signals as auto regressive processes;
    determining estimates for parameters for the auto regressive processes based on a second order estimation of a sum of said signals; and
    outputting source estimates for the degenerate mixtures to reconstruct signals from the plurality of the simultaneously-provided sources.

12. The method as recited in claim 1, further comprises the step of filtering the source estimates to provide a minimum variance.

13. The method as recited in claim 11, wherein the step of identifying the degenerate mixtures of signals as auto regressive processes includes associating polynomials with each auto regressive process such that poles are computable based on routes of the polynomial.

14. The method as recited in claim 11, wherein the step of determining estimates for parameters includes the steps of:
    determining polynomials having poles at routes of the polynomials;
    solving a linear system of equations of the polynomials;
    determining whether a partition represented by the system of linear equations is acceptable based on predetermined criteria; and
    if acceptable, setting results of the solved linear system of equations to auto regressive parameter estimates.

15. The method as recited in claim 11, wherein the step of determining estimates for parameters for the auto regressive processes includes the step of providing a gradient descent system for determining a gradient for partitions of the degenerate mixtures and determining a minimum partition based on a minimum gradient.

16. A method for estimating independent acoustic sources from degenerate mixtures comprising the steps of:

simultaneously providing samples of auto regressive parameter estimates and a predetermined signal source, wherein the auto regressive parameter estimates are derived from calculating autocovariance coefficients based on a second order estimation;

updating autocovariance coefficients using an exponential window based on the samples of auto regressive parameter estimates and the predetermined signal source;

performing a gradient descent using the updated autocovariance coefficients; and outputting updated auto regressive parameter estimates for the simultaneously-provided samples and source.

17. The method as recited in claim 16, further comprises the step of filtering the updated auto regressive parameter estimates to provide a minimum variance of error for the updated auto regressive parameter estimates.

\* \* \* \* \*